United States Patent
Rawls

(10) Patent No.: US 11,119,124 B2
(45) Date of Patent: Sep. 14, 2021

(54) NON-CONTACT VOLTAGE AND GROUND DETECTOR

(71) Applicant: Rocky Lee Rawls, Gautier, MS (US)

(72) Inventor: Rocky Lee Rawls, Gautier, MS (US)

(*) Notice: Subject to any disclaimer, the term of this patent is extended or adjusted under 35 U.S.C. 154(b) by 28 days.

(21) Appl. No.: 16/383,327

(22) Filed: Apr. 12, 2019

(65) Prior Publication Data

US 2019/0317134 A1   Oct. 17, 2019

Related U.S. Application Data

(60) Provisional application No. 62/656,475, filed on Apr. 12, 2018.

(51) Int. Cl.
| | | |
|---|---|---|
| *G01R 15/12* | (2006.01) | |
| *G01R 31/02* | (2006.01) | |
| *G01R 15/14* | (2006.01) | |
| *G01R 31/54* | (2020.01) | |

(52) U.S. Cl.
CPC ........... *G01R 15/12* (2013.01); *G01R 15/144* (2013.01); *G01R 31/54* (2020.01)

(58) Field of Classification Search
CPC ...... G01R 15/12; G01R 15/144; G01R 31/50; G01R 31/52
See application file for complete search history.

(56) References Cited

U.S. PATENT DOCUMENTS

| | | | | | |
|---|---|---|---|---|---|
| 4,584,526 | A | * | 4/1986 | Lobastov | G01R 31/52 324/133 |
| 2016/0267754 | A1 | * | 9/2016 | Hickman | G01R 1/07 |
| 2018/0328965 | A1 | * | 11/2018 | Yuan | G01R 15/18 |

* cited by examiner

*Primary Examiner* — Minh Q Phan

(57) ABSTRACT

A non-contact voltage and ground detector allows a user to easily analyze the ground or neutral port of an electrical component. The detector includes a tubular body, a metal probe, a power source, a ground-and-neutral detector mechanism, and a non-contact voltage device. The metal probe is concentrically and terminally mounted to the tubular body and acts as the physical engaging element. The power source provides the electrical energy for the detector and is mounted within the tubular body. The ground-and-neutral detector mechanism in conjunction with the metal probe set up an open circuit. The ground-and-neutral detector registers the quality of a ground or neutral when the metal probe with an external electrical element. The non-contact voltage device measures changes in magnetic fields about an electrical component to identify the presence of voltage within the electrical component.

7 Claims, 6 Drawing Sheets

NON-CONTACT VOLTAGE AND GROUND DETECTOR

The current application claims a priority to the U.S. Provisional Patent application Ser. No. 62/656,475 filed on Apr. 12, 2018.

FIELD OF THE INVENTION

The present invention generally relates to a handheld voltage and ground detection device. The present invention is a device that combines the functionality of a non-contact voltage detector and a ground detector into a two-ended device.

BACKGROUND OF THE INVENTION

Non-contact voltage detectors are commonly used by electricians around the world to quickly determine whether a wire or set of wiring is live. A live wire is one in which electricity is still flowing and is hazardous to work with. Before setting up repairs or upgrading electrical units, electricians use a non-contact voltage detector to ensure the power has been turned off. Another common test performed is determining of a ground is appropriately connected. The National Electric Code states that a ground must have less than or equal to 25-ohm resistance. In order to test this, various probes must be inserted into the ground and those probes are hooked up to special sensor using complicated wiring. This process is tedious and provides many sources of error and hazard.

An objective of the present invention is to provide a much simpler method for determining the ground and neutral of an electrical outlet, a panel, a lightning rod, a ground rod, or any other electrical component. The present invention is a pen-shaped device that includes two ends. One end functions as a non-contact voltage detector and the other end functions as a ground and neutral detector by reading the voltage created when a crystal diode is touched to a ground or neutral that is 25 ohms or less. When a resistance to ground is 25 ohms or less is present, the present invention reads the voltage created by the crystal diode and amplifies the voltage to turn on an indicator light or indictor bell. The present invention also includes a rechargeable battery that can be charged using a USB input. The present invention also solves the issue of cost of manufacturing. Since various wires and meters are not needed, a user can easily buy the present invention without spending an exorbitant amount of money.

DETAIL DESCRIPTIONS OF THE INVENTION

All illustrations of the drawings are for the purpose of describing selected versions of the present invention and are not intended to limit the scope of the present invention.

The present invention generally relates to voltage and ground detection devices. More specifically, the present invention is a hand-held ground and neutral detector that does not require an external power source and other convoluted components to accurately test and identify if a wire is properly grounded.

Figure 1:
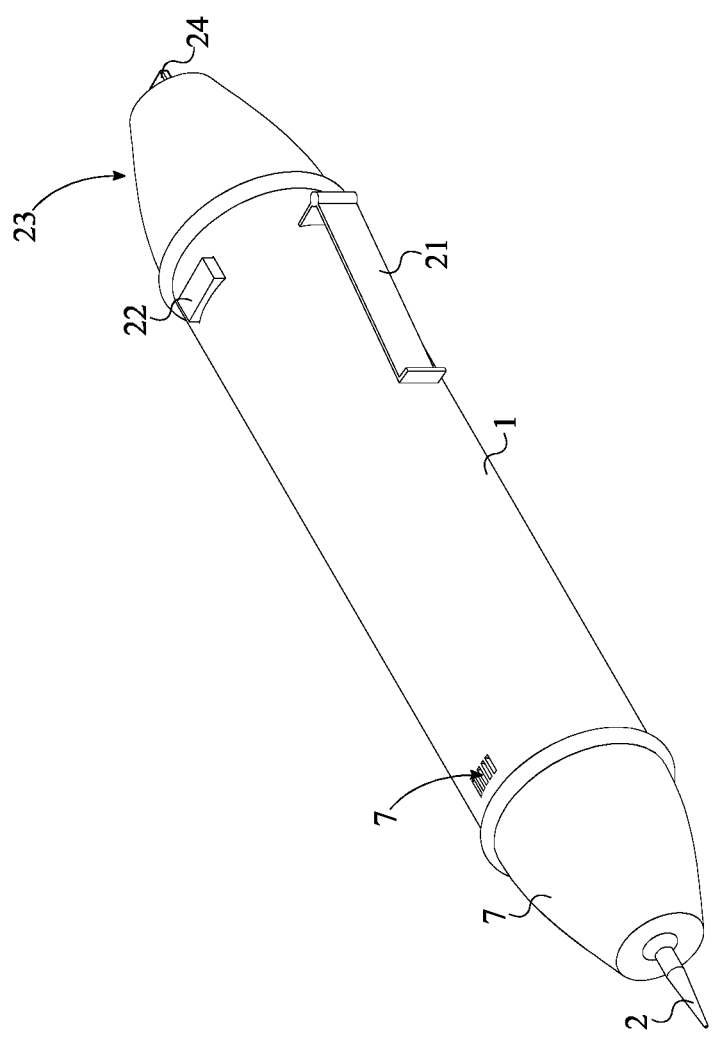
FIG. 1 is a perspective view of the present invention.
Figure 3:
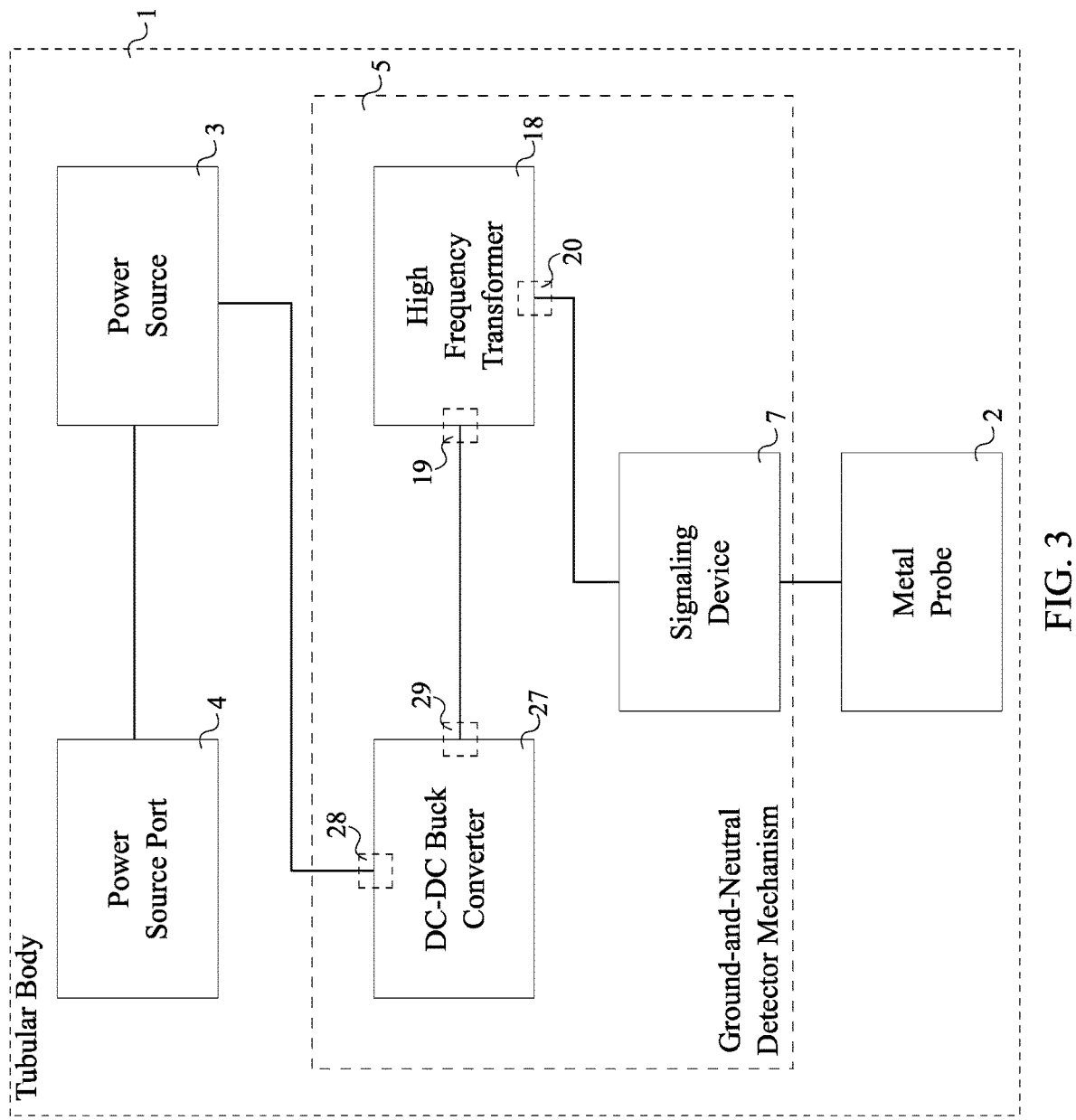
FIG. 3 is an electronic schematic diagram of the present invention.

Referring to FIG. 1 and FIG. 3, in general, the present invention comprises a tubular body 1, a metal probe 2, a power source 3, a ground-and-neutral detector mechanism 5, and a non-contact voltage device 23. The tubular body 1 is a hollow cylindrical structure that acts as the structural housing for the present invention. The metal probe 2 is an elongated shank that acts as the interface/contact element between the present invention and an external wire/circuit. The present invention is designed in a pen-style configuration for easier storage and handling. For this, the metal probe 2 is concentrically and terminally positioned with the tubular body 1, and wherein the metal probe 2 extends from the tubular body 1. Additionally, the metal probe 2 is mounted within the tubular body 1. The power source 3 provides the necessary electric energy to achieve the functions of the present invention. The power source 3 is mounted within the tubular body 1. The preferred power source 3 is a battery. The ground-and-neutral detector mechanism 5 detects if the neutral or ground of an electric outlet, a panel, a lightning rod, a ground rod, or any other electrical component is properly grounded. The ground-and-neutral detector mechanism 5 allows a user to determine if an electrical component abides the National Electric Code, wherein a building must have a 25 ohm or less ground resistance. For durability purposes, the ground-and-neutral detector mechanism 5 is mounted within the tubular body 1. Additionally, the ground-and-neutral detector mechanism 5, the power source 3, and the metal probe 2 are electrically connected to each other.

In general, the ground-and-neutral detector mechanism 5 is an open circuit that is connected to the power source 3 and the metal probe 2. Specifically, the ground-and-neutral detector mechanism 5 coverts the DC current from power source to an AC current. Additionally, the ground-and-neutral detector mechanism 5 also comprises a signaling device 7 that is powered by said AC current. The signaling device 7 is electrically connected to the metal probe 2 such that when the metal probe 2 is physically connected to a ground or a neutral, a current will flow through the ground-and-neutral detector mechanism 5. Specifically, a current will flow through the signaling device 7, thus notifying that the resistance of the ground or neutral is lower than 25 ohms.

Figure 4:
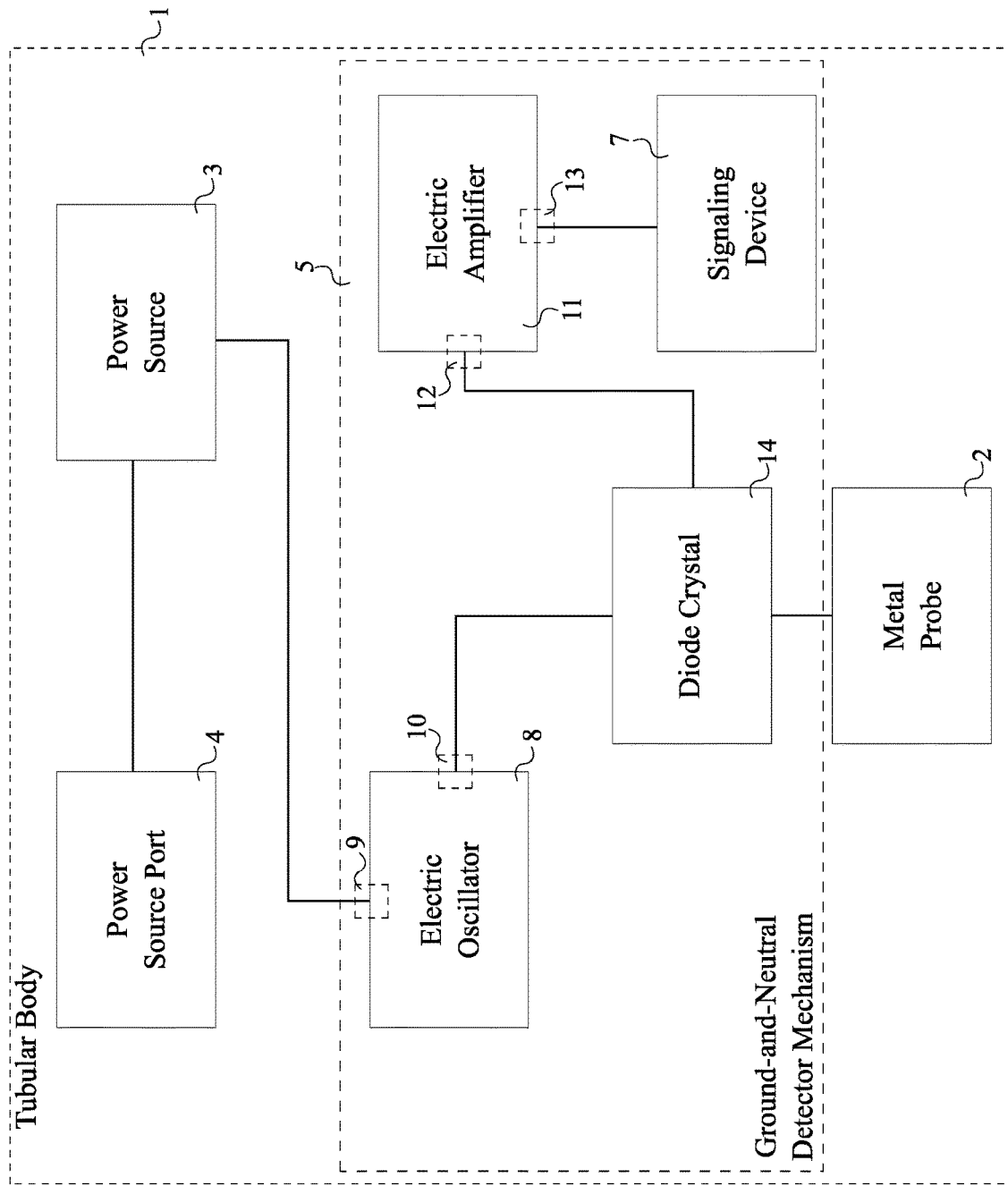
FIG. 4 is an electronic schematic diagram of an alternative embodiment of the present invention.

Referring to FIG. 4, in one embodiment of the present invention, the ground-and-neutral detector mechanism 5 comprises an electrical oscillator 8, an electric amplifier 11, a diode crystal 14, and the at least one signaling device 7. The electrical oscillator 8 converts a direct current (DC) into an alternating current (AC) and comprises an input 9 and an output 10. Specifically, the electrical oscillator 8 receives a DC current from the power source 3 and converts said current into an AC current that is directed to the diode crystal 14. For this, the power source 3 is electrically connected to the input 9 of the electrical oscillator 8. Additionally, the output 10 of the electrical oscillator 8 is electrically coupled to the diode crystal 14. Preferably, the output 10 of the electrical oscillator 8 is electrically coupled to the diode crystal 14 by an am transmitter and an antenna/step up transformer. Specifically, the output 10 of the electrical oscillator 8 is electrically connected to the am transmitter; the am transmitter is electrically connected to the antenna/step up transformer; and, the antenna/step up transformer is electrically connected to the diode crystal 14. Furthermore, the diode crystal 14 is electrically connected to the metal probe 2. This creates an open circuit with negligible voltage until the metal probe 2 is physically connected to an external electrical component. Once the metal probe 2 is connected to a proper ground or neutral, i.e. a ground or neutral with a resistance less than 25 ohms, the electric path closes; and, an electric current will flow across the diode crystal 14 in a single direction. The electric amplifier 11 and the signaling device 7 notify the user that there is an electric current and, resultantly, that the ground or neutral is of appropriate resistance. Specifically, an input 12 of the electric amplifier 11 is electrically connected to the diode crystal 14 and an output 13 of the electric amplifier 11 is electrically connected to the signaling device 7. The signaling device 7 notifies the user either through an audible sound or a visual effect. Specifically, the signaling device 7 may be implemented as a light or a speaker. For this, the signaling device 7 is mounted to the tubular body 1.

Figure 5:
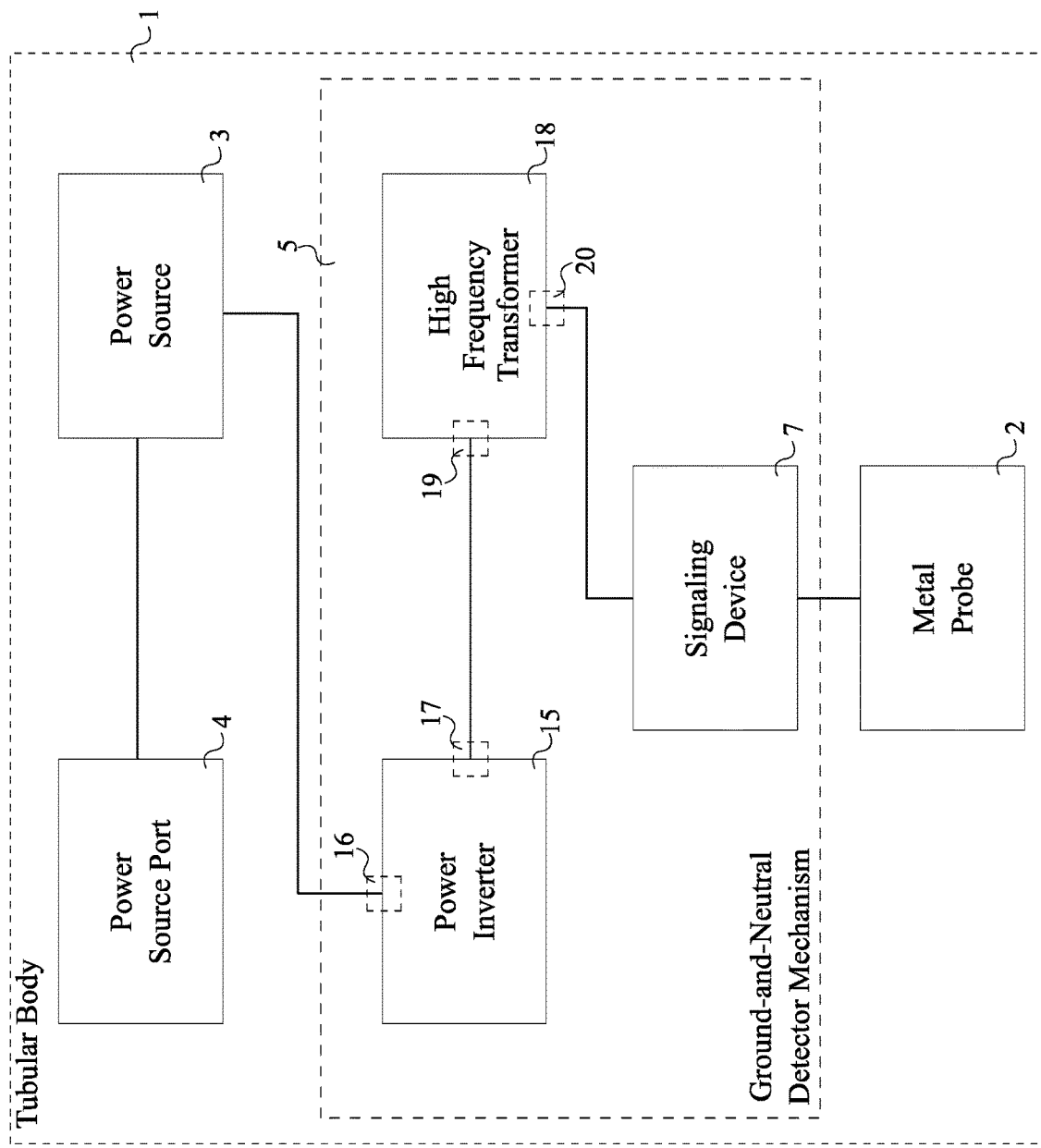
FIG. 5 is an electronic schematic diagram of an alternative embodiment of the present invention.

Referring to FIG. 5, in another embodiment of the present invention, the ground-and-neutral detector mechanism 5 comprises a power inverter 15, a high frequency transformer 18, and the at least one signaling device 7. The power inverter 15 converts a DC current into an AC current from the power source. For this, the power source 3 is electrically connected to an input 16 of the power inverter 15. The high frequency transformer 18 increases the AC current from the power inverter 15 enough to activate the signaling device 7. For this, an output 17 of the power inverter 15 is connected to an input 19 of the high frequency transformer 18. An output 20 of the high frequency transformer 18 is electrically connected to the signaling device 7; and, the signaling device 7 is electrically connected to the metal probe 2. Thus, when the metal probe 2 is physically connected to a proper ground or neutral, current will flow through the signaling device 7 and the present invention audibly or visually signals to the user that the ground or neutral is adequate.

Referring to FIG. 3, in another embodiment of the present invention, the ground-and-neutral detector mechanism 5 comprises the high frequency transformer 18, a DC-DC buck converter 27, and the at least one signaling device 7. The DC-DC buck converter 27 stabilizes the DC power from the power source 3 to keep the voltage/current regulated. The DC-DC buck converter 27 is adjustable to raise/lower the current/voltage into the high frequency transformer 18. The adjustability of the DC-DC buck converter 27 can control the sensitivity of the signaling device 7. For this, an input 28 of the DC-DC buck converter 27 is electrically connected to the power source 3. The high frequency transformer 18 converts the DC current/voltage from the DC-DC buck converter 27 into an AC voltage/current. Specifically, an output 29 of the DC-DC buck converter 27 is electrically connected to the input 19 of the high frequency transformer 18. In general, the DC-DC buck converter 27 keeps the current/voltage from the power source 3 from being too high/low to keep from having false readings and fluctuations. The resulting AC current/voltage is directed from the high frequency transformer 18 to the signaling device 7. For this, the output 20 of the high frequency transformer 18 is electrically connected to the signaling device 7. The signaling device 7 is further electrically connected to the metal probe 2. Thus, when the metal probe 2 is physically connected to a proper ground or neutral, current will flow through the signaling device 7 and the signaling device 7 is activated to audibly or visually signal to the user that that ground or neutral is adequate.

The at least one signaling device 7 may be implemented either as an audible signaling device and a visual signaling device; the use of either or both of the audible signaling device and the visual signaling device may also be implemented for the present invention. The audible signaling device is an electromechanical device that produces sound. Type of devices that may be used as the audible signaling device includes, but is not limited to, an electrostatic speaker, a digital speaker, and other similar devices. To allow the user to hear the audible signaling device, the audible signaling device is integrated into the tubular body 1 with adjacent vents integrated into the tubular body 1. The visual signaling device is an electric light that converts electrical energy into visible light. To convey to the user that the ground or the neutral is of proper design, the visual signaling device is integrated into the tubular body 1. A variety of devices may be used as the visual signaling device including, but not limited to, light-emitting diodes, incandescent light bulbs, and other similar devices.

To activate or deactivate the ground-and-neutral detector mechanism 5, the present invention further comprises a power button 22. The power button 22 controls the electrical connection in between the power source 3 and the ground-and-neutral detector mechanism 5, and any other electrical components of the present invention. This allows the present invention to conserve the electric charge of the power source 3 when the present invention is not in use. The power button 22 is laterally mounted to the tubular body 1. Additionally, the power button 22 is electrically connected in between the ground-and-neutral detector mechanism 5 and the power source 3.

Figure 2:
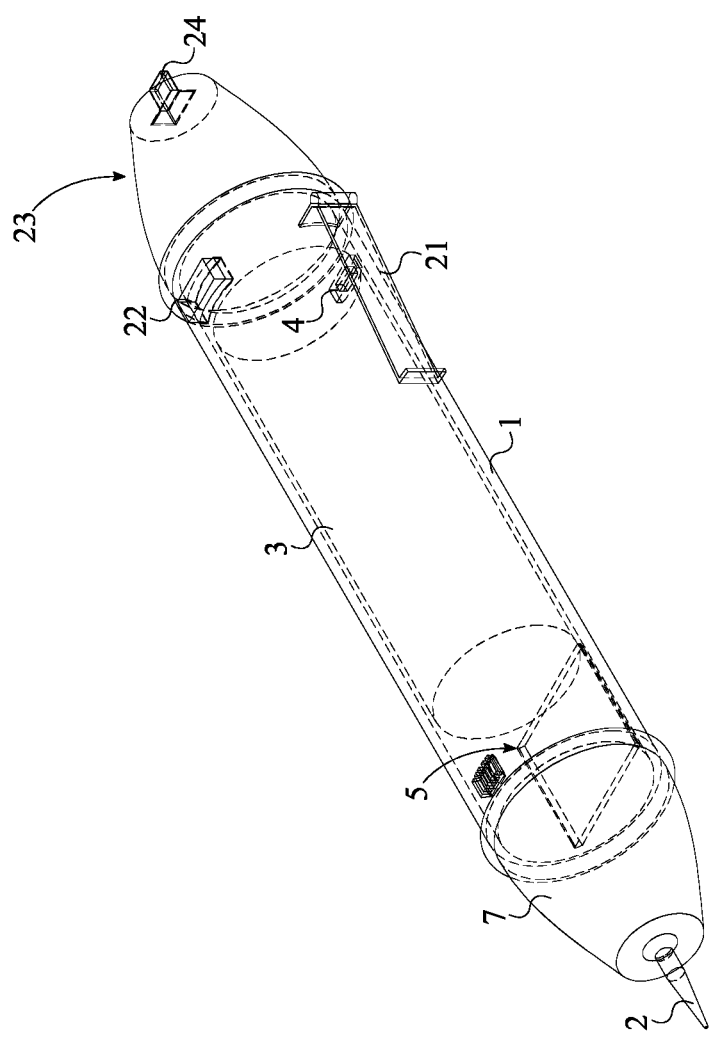
FIG. 2 is an internal perspective view of the present invention.

For increased portability and ease of use, in one embodiment, the present invention further comprises a power supply port 4 and a holding clip 21. The power supply port 4 allows the user to easily recharge the power source 3. For this embodiment, the power source 3 is a rechargeable battery. Referring to FIG. 2, the power supply port 4 is laterally integrated into the tubular body 1. Additionally, the power supply port 4 is electrically connected to the rechargeable battery. A variety of electrical connectors may be used as the power supply port 4 including, but not limited to, a universal serial bus (USB) port, a lightning port, a micro USB port, and other similar connectors. The holding clip 21 allows the present invention to be attached/clipped to clothing, paper, and other similar items for increased portability and storage capabilities. The holding clip 21, similar to that of a pen, is an L-shaped structure that is composed of a thin piece of flexible material. The holding clip 21 is positioned opposite the metal probe 2, along the tubular body 1. Additionally, the holding clip 21 is laterally and externally connected to the tubular body 1. Specifically, a short leg of the holding clip 21 is laterally and perpendicularly connected to the tubular body 1.

Referring to FIG. 2, the non-contact voltage device 23 is a quick and safe way of checking if a wire, an outlet, a switch, or any other electrical component has an electric current running through it. Specifically, the non-contact voltage device 23 detects a changing magnetic field around an energized object, i.e. an object with an alternating current running through it. A variety of means may be used to achieve this. One potential way utilizes a multitude of transistors that are connected to a detector antenna 24. The non-contact voltage device 23 is positioned opposite to the metal probe 2, along the tubular body 1. Additionally, the non-contact voltage device 23 is terminally mounted to the tubular body 1. Furthermore, the detector antenna 24 is oriented away from the metal probe 2. Resultantly, a first end of the present invention is used to check the neutral or ground of an electric component while a second end of the second end is used to check the presence of an alternating current of an electric component. The non-contact voltage device 23 is electrically connected to the power source 3, preferably through the power button 22 to allow the user to turn on and off the non-contact voltage device 23.

Figure 6:
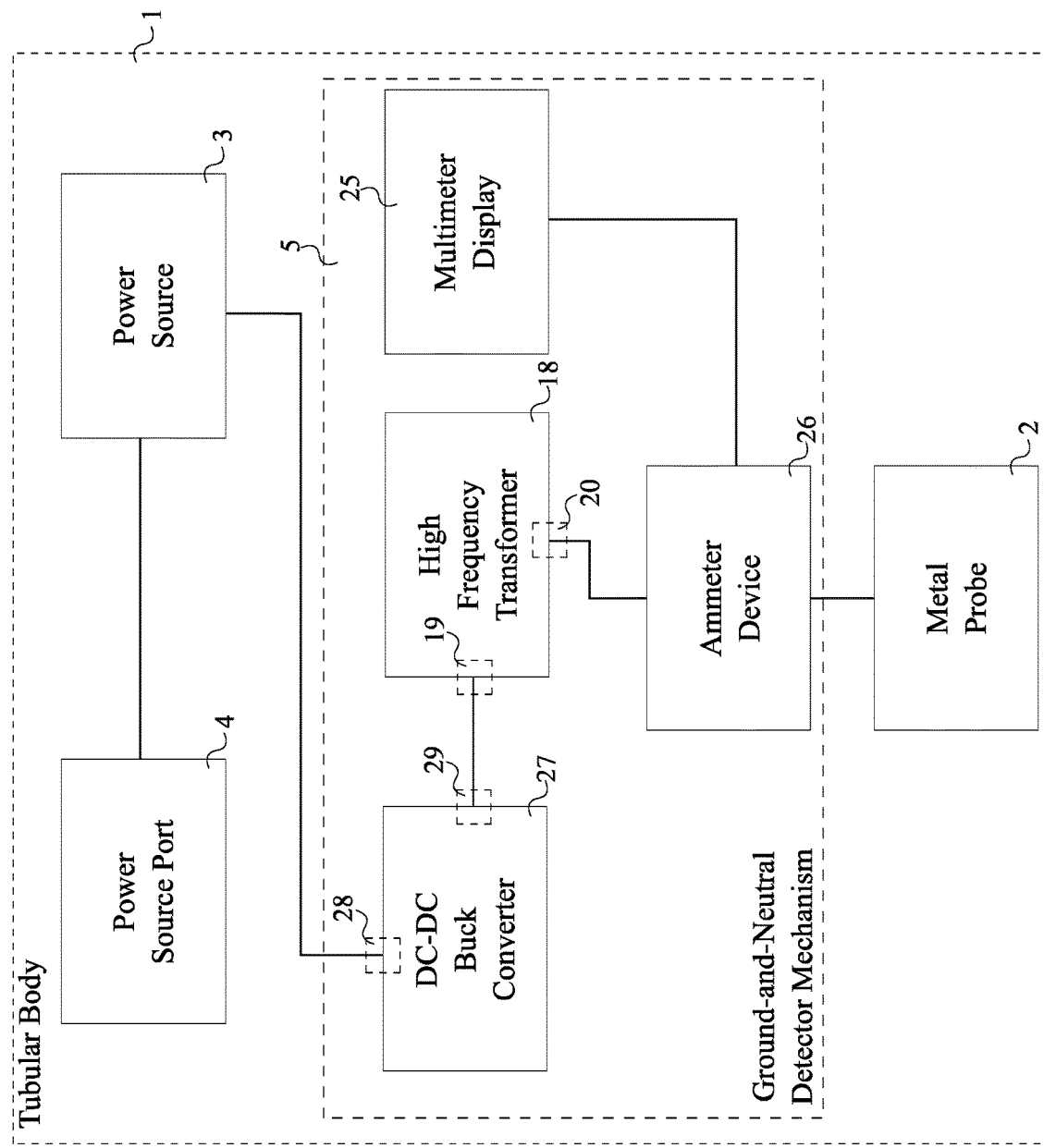
FIG. 6 is an electronic schematic diagram of an alternative embodiment of the present invention.

Referring to FIG. 6, in one embodiment, the present invention is implemented as a multimeter ground check function. Specifically, this allows a user to check a ground or a neutral of an electrical component without having to have a live wire. For this, the ground-and-neutral detector mechanism 5 comprises the DC-DC buck converter 27, the high frequency transformer 18, a multimeter display 25, and an ammeter device 26. The power source 3 provides electrical power to DC-DC buck converter 27; thus, the power source 3 is electrically connected to an input 28 of the DC-DC buck converter 27. In an alternative embodiment, the DC-DC buck converter 27 may be replaced with the power inverter 15. The DC-DC buck converter 27 regulates the current/voltage going into the high frequency transformer 18 from the power source 3. Specifically, an output 29 of the DC-DC buck converter 27 is electrically connected to the input 19 of the high frequency transformer 18. The high frequency transformer 18 adjusts the current/voltage from the DC-DC buck converter 27. In an alternative embodiment of the present invention, the high frequency transformer 18 may be replaced with an isolation transformer. The output 20 of the high frequency transformer 18 is electrically connected to the ammeter device 26. The ammeter device 26 measures the electric current within a circuit. Thus, the ammeter device 26 is electrically connected to the metal probe 2; wherein the metal probe 2 acts as a multimeter lead for the ammeter device 26. When the multimeter lead is touched to a proper ground current will flow from the high frequency transformer 18 which can be read by the ammeter device 26. The multimeter display 25 graphically conveys data sensed by the ammeter device 26 to the user. The multimeter display 25 may be digital or analog. The multimeter display 25 is electrically connected to the ammeter device 26 to receive said current reading from the ammeter device.

Although the invention has been explained in relation to its preferred embodiment, it is to be understood that many other possible modifications and variations can be made without departing from the spirit and scope of the invention as hereinafter claimed.

What is claimed is:

1. A non-contact voltage and ground detector comprising:
   a tubular body;
   a metal probe;
   a power source;
   a ground-and-neutral detector mechanism;
   the metal probe being concentrically and terminally positioned with the tubular body;
   the metal probe being positioned extending from the tubular body;
   the metal probe being mounted to the tubular body;
   the power source being mounted within the tubular body;
   the ground-and-neutral detector mechanism being mounted within the tubular body;
   the ground-and-neutral detector mechanism, the power source, and the metal probe being electrically connected to each other,
   the ground-and-neutral detector mechanism comprising an electrical oscillator, an electric amplifier, a diode crystal, and at least one signaling device;
   the electric oscillator comprising an input and an output;
   the electric amplifier comprising an input and an output;
   the power source being electrically connected to the input of the electric oscillator;
   the output of the electric oscillator being electrically coupled to the diode crystal;
   the diode crystal being electrically connected to the metal probe;
   the input of the electric amplifier being electrically connected to the diode crystal;
   the output of the electric amplifier being electrically connected to the signaling device; and
   the signaling device being mounted to the tubular body.

2. The non-contact voltage and ground detector as claimed in claim 1 comprising:
   a power supply port;
   the power source being a rechargeable battery;
   the power supply port being laterally integrated into the tubular body; and
   the power supply port being electrically connected to the rechargeable battery.

3. The non-contact voltage and ground detector as claimed in claim 1 comprising:
   the signaling device being an audible signaling device; and
   the audible signaling device being integrated into the tubular body.

4. The non-contact voltage and ground detector as claimed in claim 1 comprising:
   the signaling device being a visual signaling device; and
   the visual signaling device being integrated into the tubular body.

5. The non-contact voltage and ground detector as claimed in claim 1 comprising:
   a holding clip;
   the holding clip being positioned opposite the metal probe, along the tubular body; and
   the holding clip being laterally and externally connected to the tubular body.

6. The non-contact voltage and ground detector as claimed in claim 1 comprising:
   a power button;
   the power button being laterally mounted to the tubular body; and
   the power button being electrically connected in between the ground-and-neutral detector mechanism and the power source.

7. The non-contact voltage and ground detector as claimed in claim 1 comprising:
   a non-contact voltage device;
   the non-contact voltage device being positioned opposite to the metal probe, along the tubular body;
   the non-contact voltage device being terminally mounted to the tubular body;
   a detector antenna of the non-contact voltage device being oriented away from the metal probe; and
   the non-contact voltage device being electrically connected to the power source.

* * * * *